(12) United States Patent
Timmons et al.

(10) Patent No.: US 8,088,451 B2
(45) Date of Patent: Jan. 3, 2012

(54) COVALENTLY FUNCTIONALIZED PARTICLES FOR SYNTHESIS OF NEW COMPOSITE MATERIALS

(75) Inventors: Richard B. Timmons, Arlington, TX (US); Dattatray Wavhal, Maharashtra (IN); Dhiman Bhattacharyya, St. Louis, MO (US); Narayan Mukherjee, Arlington, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 237 days.

(21) Appl. No.: 12/404,172

(22) Filed: Mar. 13, 2009

(65) Prior Publication Data

US 2009/0240013 A1 Sep. 24, 2009

Related U.S. Application Data

(60) Provisional application No. 61/036,418, filed on Mar. 13, 2008.

(51) Int. Cl.
*B05D 1/22* (2006.01)
(52) U.S. Cl. ... 427/460; 977/788; 977/811; 106/287.19; 528/68
(58) Field of Classification Search .................. 427/460; 977/788, 811; 106/287.19; 528/68
See application file for complete search history.

(56) References Cited

U.S. PATENT DOCUMENTS

| 5,876,753 | A | 3/1999 | Timmons et al. |
| 6,712,997 | B2 | 3/2004 | Won et al. |
| 7,063,748 | B2 | 6/2006 | Talton |
| 7,250,195 | B1 * | 7/2007 | Storey et al. .................. 427/475 |
| 7,749,299 | B2 * | 7/2010 | Vanheusden et al. ........... 75/362 |
| 2003/0148042 | A1 | 8/2003 | Wang |
| 2005/0228111 | A1 * | 10/2005 | Furuzono et al. ............. 524/497 |
| 2009/0099282 | A1 * | 4/2009 | Muller et al. ................. 524/100 |

FOREIGN PATENT DOCUMENTS

| JP | 2005-179661 | 7/2005 |
| KR | 2005-0054349 A | 6/2005 |
| KR | 2006-0036342 A | 4/2006 |
| KR | 2007-0040173 A | 4/2007 |

OTHER PUBLICATIONS

International Search Report and Written Opinion for PCT/US2009/037199 dated Oct. 28, 2009.

* cited by examiner

*Primary Examiner* — Peter D Mulcahy
(74) *Attorney, Agent, or Firm* — Chainey P. Singleton; Edwin S. Flores; Chalker Flores, LLP

(57) ABSTRACT

The present invention includes compositions and methods for synthesis of composite materials involving gas phase plasma polymerization to covalently plasma graft an organic molecule onto particles; covalently binding an organic monomer to the functionalized particles; and, polymerizing the organic monomers into hybrid polymer composite materials.

11 Claims, 1 Drawing Sheet

COVALENTLY FUNCTIONALIZED PARTICLES FOR SYNTHESIS OF NEW COMPOSITE MATERIALS

CROSS-REFERENCE TO RELATED APPLICATIONS

This application claims priority to U.S. Provisional Application Ser. No. 61/036,418, filed Mar. 13, 2008, the entire contents of which are incorporated herein by reference.

TECHNICAL FIELD OF THE INVENTION

The present invention relates in general to the field of composite materials, and more particularly, to compositions and methods for covalently functionalizing materials into hybrid nanocomposites.

STATEMENT OF FEDERALLY FUNDED RESEARCH

None.

BACKGROUND OF THE INVENTION

Without limiting the scope of the invention, its background is described in connection with composite materials.

Synthesis of particle containing composite materials is a very active area of technology. This activity reflects the fact that these composites represent an opportunity to create novel new materials. Potential applications, recently noted or patented for such new materials, include optoelectronics, coatings, sealants, caulks, adhesives, and biofunctional materials, as but a few of the examples in this area.

A variety of innovative techniques have been employed to prepare these hybrid inorganic-organic materials. However, the preparation processes employed are liquid based and generally involve simple physical mixing of the inorganic or metallic particles with the liquid reagents. Typically, if preliminary coating of the particles is attempted, it involves simple physical adsorption of an organic compound, usually the monomer, unto the inorganic moiety, followed by subsequent polymerization of the monomer to create the final composite polymeric assembly.

In contrast with the above procedures, the present invention involves covalent attachment of the particles to the polymeric organic matrix. Briefly, a plasma deposition step is initially employed to deposit reactive functional groups, strongly grafted, on the surface of a solid substrate, followed by immersion of the coated substrate in a solution during which time target molecules react with the functional surface groups introduced during the plasma process, as taught in U.S. Pat. No. 5,876,753, issued to Timmons, et al., for molecular tailoring of surfaces. In this way, the targeted molecules are attached to the surface during this second step. The two-step process is of general use because the nature of the plasma introduced surface groups and the nature of the solute molecules can be varied. Additionally, it is possible to provide exact control of the surface density of reactive groups introduced during the plasma process and thus the concentration of targeted molecules coupled to the solid surfaces. The second step chemical derivatization reactions can be carried out using aqueous or non-aqueous solutions at variable temperatures

SUMMARY OF THE INVENTION

The present invention includes compositions and methods for covalent surface functionalization of fine particles instead of the simple physical mixing of reagents. The present invention is a surface functionalization process that causes covalent attachment of a wide range of reactive groups on to particles, independent of the nature, or size, of the particles. The functionalized particle(s) may also be bound covalently to an organic molecule (e.g., a monomer), followed by a polymerization processes to create a hybrid nanocomposite structure.

The present invention includes compositions and methods for making novel hybrid materials by covalently plasma grafting an organic molecule onto a particle; covalently binding an organic monomer to the organic molecule on the particle; and polymerizing the monomers into a polymer. In one aspect, the plasma grafting uses a continuous-wave (CW) plasma or pulsed plasma. In one aspect, the particles comprise micro or nanoparticles, metal particles or inorganic particles In one aspect, particle comprises an element, alloy, oxide or nitride of a metal or non-metal selected from the group consisting of Ga, Au, Ag, Cu, Al, Ta, Ti, Ru, Ir, Pt, Pd, Os, Mn, Hf, Zr, V, Nb, La, Y, Gd, Sr, Ba, Cs, Cr, Co, Ni, Zn, Ga, In, Cd, Rh, Re, W, Mo, Si, Se, Te, As, Sb, Bi, Ge, Sn, Pb. In one aspect, the grafting of reactive organic functional groups to the particles, is achieved using a gas phase pulsed plasma that covalently binds the organic molecule to the particle. The organic compound plasma polymerized for this purpose includes a reactive functional group such as a carboxy, halide, epoxy, isocyanate, hydroxyl, amine, aldehyde, alkene, alkyne, aromatic, ether, ketone, ester, amide, amino acid group, nitro, nitrile, thiol, phosphate group, lipid, phospholipid. In yet another aspect, the hybrid material is formed into a film, a gel, a block, a powder, a pellet or a solution.

Another embodiment of the present invention is a method of making a hybrid nanocomposite material by covalently plasma grafting a small organic molecule onto a nanoparticle; covalently attaching an organic monomer to the particle at the organic molecule; and polymerizing the organic monomers into a hybrid nanocomposite. In one aspect, the plasma grafting uses a continuous-wave (CW) plasma or pulsed plasma. In one aspect, the particles comprise micro or nanoparticles, metal particles, inorganic or organic particles. In one aspect, the plasma grafting step is by gas phase pulsed plasma covalent binding of the organic molecule to the particle. In one aspect, particle comprises an element, alloy, or inorganic compound of a metal selected from the group consisting of Ga, Au, Ag, Cu, Al, Ta, Ti, Ru, Ir, Pt, Pd, Os, Mn, Hf. Zr, V, Nb, La, Y, Gd, Sr, Ba, Cs, Cr, Co, Ni, Zn, Ga, In, Cd, Rh, Re, W, Mo, Si, Se, Te, As, Sb, Bi, Ge, Sn, Pb. In another aspect, the organic molecule is a carboxy group, a halide, an epoxy group, an isocyanate group, a hydroxyl group, an amine group, aldehyde group, acid group, alkyl group, alkane group, alkene group, alkyne group, aromatic group, alcohol group, ether group, ketone group, ester group, amide group, amino acid group, nitro group, nitrile group, carbohydrate group, thiol group, organic phosphate group, lipid group, phospholipid group and steroid group. In yet another aspect, the hybrid material is formed into a film, a gel, a block, a powder, a pellet or a solution. Yet another embodiment of the present invention is a hybrid nanocomposite made by the methods of the present invention.

Another embodiment of the present invention is a hybrid nanocomposite comprising a nanoparticle, an organic molecule covalently attached to the nanoparticles by plasma grafting, and a polymer attached to the organic molecule.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

Figure 1:
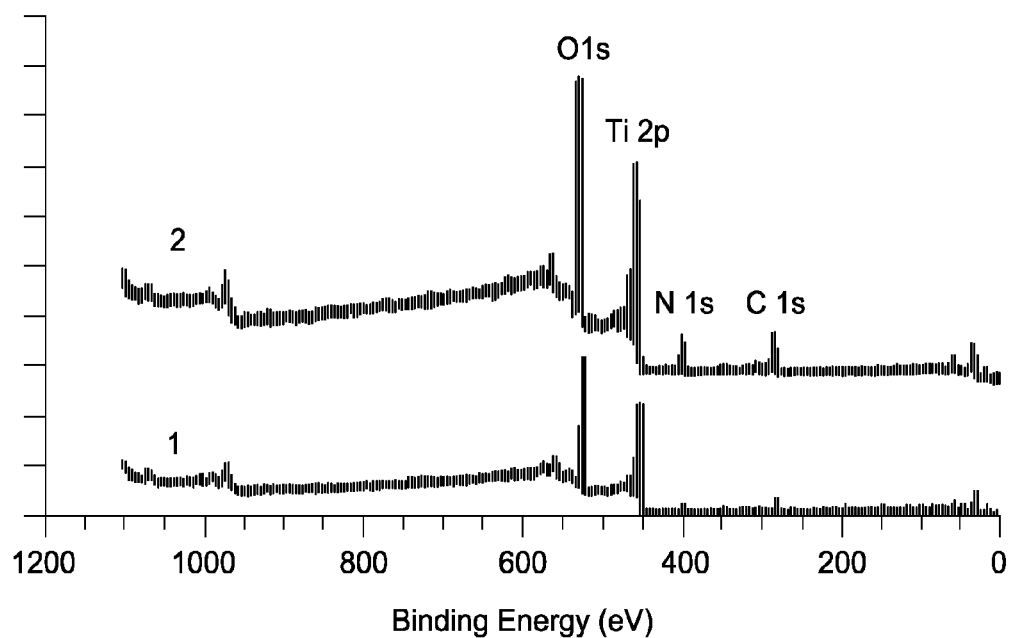
FIG. 1. Representative XPS survey spectra for pure $TiO_2$ (1) and amine functionalized $TiO_2$ (2)

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

As used herein, the term "particle" refers to a molecular target that may be as small as a small cluster of atoms but as large as a surface that may be a single element, alloy, mixture, inorganic or organic material. Non-limiting examples of targets also include particles that have been functionalized, e.g., an oxide, a nitride, a carbide of a substrate or metal selected from the group consisting of Ga, Au, Ag, Cu, Al, Ta, Ti, Ru, Ir, Pt, Pd, Os, Mn, Hf. Zr, V, Nb, La, Y, Gd, Sr, Ba, Cs, Cr, Co, Ni, Zn, Ga, In, Cd, Rh, Re, W, Mo, Si, Se, Te, As, Sb, Bi, Ge, Sn, Pb. Non-limiting examples of substrates include, e.g., a single crystal such as silicon, or an at least partially amorphous substrate, e.g., glass, plastic, polymer, quartz or combinations thereof. The substrate may be biodegradable, electrically conductive, thermally conductive, magnetic, porous, stimulatable, or combinations thereof. A particle that has an average diameter in the sub-micron range is referred to herein as a nanoparticle.

As used herein, an "organic molecule" refers to a molecule that includes carbon. Organic molecules can include a variety of side groups, such as, e.g., a carboxy group, a halide, an epoxy group, an isocyanate group, a hydroxyl group, an amine group, aldehyde group, acid group, alkyl group, alkane group, alkene group, alkyne group, aromatic group, alcohol group, ether group, ketone group, ester group, amide group, amino acid group, nitro group, nitrile group, carbohydrate group, thiol group, organic phosphate group, lipid group, phospholipid group and steroid group.

The present invention differs significantly from prior work in this area. The distinguishing feature of this invention centers on covalent surface functionalization of fine particles, in lieu of the simple physical mixing of reagents, as employed by prior workers. The surface functionalization process permits covalent attachment of a wide range of reactive groups on to the particles, independent of the nature, or size, of the particles. The functionalized particle is then covalently bound to an organic monomer, followed by traditional polymerization processes to create the hybrid nanocomposite structures.

There are many inherent advantages associated with substitution of covalently modified particles for the simple physical adsorption coating processes currently employed. The most important of these is that the covalent approach eliminates the inevitable slow phase separation which accompanies the physical mixture of diverse materials. This phase separation results in slow degradation of the physical properties of the composites. Additionally, this phase separation severely limits the extent of particle loading available under current preparation procedures. A further distinct advantage of the covalent approach is that, by reducing particle aggregations, it permits more uniform distribution of the particles in the polymer matrices, an important consideration in improving the physical properties of these hybrid materials. Finally, the strong covalent attachment of the particles to the matrix provides improved physical and mechanical characteristics of the hybrids, including fracture mechanics, thermal stabilities and tribological properties.

The present invention centers on the use of a gas phase pulsed plasma polymerization process to covalently graft functionalized coatings on to particles. The functional groups, so introduced, are then used to covalently bind the particles to an organic monomer. The organic monomer is then subsequently polymerized, using conventional solution polymerizations processes, to create the final desired composite material.

Although continuous-wave (CW) plasma may also be considered for use in this invention, the pulsed plasma approach is preferred. The use of pulsed plasma permits controllable retention of reactive functional groups present in a monomer as it forms a polymeric film on the particles. In the present case, this is a very important consideration in that the reactive functional groups, covalently bound to the particles, are subsequently employed to covalently attach the particle to a target molecule using conventional coupling reactions. The pulsed plasma approach also permits precise control of the density of the reactive groups deposited on the particle, a second important consideration with respect to the present invention, as described below.

A 360° rotatable plasma reactor was employed to functionalize the particles. Grooves located on the sides of the reactor are used to transport the particles upward for subsequent gravitational descent through the plasma discharge zone. The continued agitation of the particles, provided by rotation of the reactor, serves to overcome particle aggregation, thus continuing to expose the surfaces of the particles to the plasma discharge. Particle aggregation becomes an increasingly important hurdle as the particle size employed becomes smaller and its surface to volume ratio increases.

High resolution TEM spectra reveal that uniform, conformal polymer films can be deposited on fine particles, including nanoscale materials, via use of the rotating reactor approach. It is believed, but not a limitation of the invention, that in addition to the rotational motion, the large negative charges, spontaneously acquired by substrates in direct contact with the plasma discharge, create strong repulsive interactions which are effective in helping overcome the tendency for particle aggregation. These repulsive interactions will become increasingly more significant as the particle size is decreased, thus permitting uniform coating of even nanoscale materials. The particle separation is important in that under pulsed plasma conditions the majority of the film thickness is deposited during the plasma off periods, thus permitting retention of monomer functional groups in the polymer films deposited. Thus, the pulsed plasma coating procedure involves brief plasma on period during which time the particles become charged, and thus separated, while highly reactive ion-radicals and other reactive species are created by the discharge by dissociation of the monomers. This is followed by generally longer plasma off periods during which time the major polymer formation, and thus coating, occurs.

Another option, made available by the pulsed plasma approach, is providing a convenient route to gradient layered films during the course of the plasma depositions. For the present invention, this is generally an important necessity in helping bridge the inherent incompatibilities between inorganic (or metallic) substrates and the organic monomers with respect to providing strongly adherent, covalently bonded thin polymeric films to the substrates. Gradient layered films are employed to bridge this transition. Initially, a very high plasma duty cycle, or brief CW plasma, operated at very high power input, is used to activate the surfaces of the substrate particles. This activation permits covalent grafting of a carbonaceous material to the inorganic or metallic surfaces, as assisted by the high energy impacts created by the positively charged radical species, produced by the plasma discharge, impacting with the negatively charged particle substrates. The composition of this initial carbonaceous film bears virtually no resemblance to the monomer being discharged. The high plasma power density employed, coupled with low reactor pressures, leads to dissociation of the monomer and formation of what is best described as an amorphous carbon-like material. This carbonaceous layer provides a viable reactive starting surface for the subsequent functionalization of the particles. In subsequent reactions, the pulsed plasma duty cycle is slowly decreased, thus changing the composition of the film being deposited, as progressive changes in film compositions are observed with sequential changes in the plasma duty cycles. The change in plasma duty cycle can also be accompanied with a change in peak power input or monomer pressures, if desired. As the ratio of plasma on to plasma off times are slowly decreased, the polymer film being deposited on the particles retains an increasing similarity to the monomer being polymerized, all the while the successive films being tightly covalently bound to each other. As monomer, we frequently use a functionalized alkene, such as a functionalized allyl or vinyl compound. During the particle coating step, with increasingly long plasma off times, the polymerization occurs increasingly through the double bond of the monomer and this is accompanied by an increasing retention, in the polymer film, of whatever functional group (or groups) may have been present in the starting alkene or alkyne.

Following successful covalent attachment of reactive functional groups to the particle surfaces, the particles are then covalently coupled to an appropriate monomer using simple, well established chemical reactions. Given the wide range of surface functionalities available for attachment to the particles, coupled with the wide range of functionalized monomers available, a diverse option of chemistries can be employed for this second step. As but one of many examples, particles having —COOH groups can be reacted with unsaturated alcohols to produce unsaturated esters. Subsequently, the polymerization of the unsaturated ester, which is now covalently bonded to the particle, is carried out, again using conventional polymerization routes. The final products, so generated, contain particle substrates firmly and covalently bonded to the polymer matrix. The final polymerization step can be accomplished in a variety of ways, for example, via addition of free radical initiators and/or by exposure to UV radiation.

In addition to the key aspect of covalent particle functionalization noted above, there are a number of unique aspects involved in the present invention which deserve explicit mention. These unique aspects center on the unusual level of compositional controllability made available by this invention. This controllability extends to the following factors: 1. The nature and size of the particles employed. 2. The use of gradient layered films to accomplish the covalent particle functionalizations. 3. The conformal aspect of the plasma coating process. 4. The precise controllability of the surface density of the functional groups covalently attached to the particles. 5. The diverse range of functional groups which can be covalently attached to the nanoparticles. 6. The wide variety of functionalized organic monomers to which the functionalized fine particles will be covalently attached. This includes variations in the chain length and degree of unsaturation present in the monomer. 7. The variety of added compounds which can be employed to function as co-polymers in forming the final product, if so desired.

1. Nature and size of the particles: An important, and well recognized, feature of plasma polymerization, as a coatings process, is that it is applicable to any solid substrate, regardless of substrate composition or shape. In the case of the present invention this includes not only inorganic species, but also metals and organic based particles as well. We have demonstrated this capability with a variety of inorganic particles, as well as with metals and organic fine particles.

An additional important feature of the plasma coating process is that it is applicable to particles covering a diverse range of sizes and shapes. Particles which we have successfully treated include some as small a few nanometers, up to sizes in the tens and hundreds of microns. It is well recognized that as particle size is decreased, liquid based coating processes become increasingly ineffective as a result of increasing particle aggregation with decreasing particle size. Given the difficulty of coating ultra fine powders by conventional wet coating methods, it is anticipated that the present invention will be particularly advantageous in dealing with smaller particles, especially when dealing with nanoparticles.

2. Gradient layered films: It is not possible to covalently bond an organic film to an inorganic or metallic substrate via a simple one-step process. This simply reflects the inherent differences in composition, structure and reactivity of these diverse materials. However, under high energy particle bombardment, such as those present during a plasma discharge, reactive sites (dangling bonds) can be created on the surfaces of inorganic and metallic species. These reactive sites are then available for the covalent coupling of the dissimilar organic species to these surfaces. The plasma approach, particularly as operated under pulsed conditions, provides a convenient route to achieving this covalent functionalization. After a brief initial step of high duty cycle or CW/high power plasma discharge to graft carbonaceous material to the particle surfaces, subsequent steps, in which the plasma duty cycle is sequentially reduced, is employed to deposit an outer coating having the precisely desired composition. The entire process can be accomplished in a short time, typically a few minutes, dependent on film thickness desired.

3. Conformal aspect of plasma coatings: Since the surface functionalization is carried out via a gas phase process, all areas exposed to the gases are coated equally, thus providing a conformal coating. These studies demonstrate that the conformal application is applicable to objects of all types of shapes and sizes, including nanoparticles and fibers. The conformal nature of these films provides complete surface coverage of the particles in a highly efficient manner.

4. Controllability of the surface density of covalently attached functional groups: Dependent on the pulsed plasma duty cycle employed in the final coating stage, we are able to vary, in a highly controlled fashion, the surface density of reactive functional groups attached to the particles. This is another unique and important feature of this invention. The ability to control the surface density of these reactive groups is particularly important in synthesizing the composite polymeric materials of this invention in that it provides a convenient way to adjust the cross-link density of the resultant products, a critical consideration in optimizing the physical properties of the composite materials.

5. The diverse range of functional groups covalently bound to the particles: We have demonstrated that the variable duty cycle pulsed plasma approach can be used to functionalize surfaces with a wide range of functional groups. Examples include —COOH, —NH$_2$, —OH, —SH, —COCl, halides, epoxides, isocyanates, anhydrides as but a few of these functionalities. Any low molecular weight monomer, containing these or other functional groups, can be polymerized by pulsed plasmas under conditions which will result in controlled retention of the functional groups present on the monomers.

6. Range of monomers to which the nanoparticles will be covalently coupled: The availability of a wide range of reactive motifs on the particles, as described in #5 above, provides for a rich and diverse chemistry with respect to monomer selection for use in the next processing step involving covalent coupling of the particle to an unsaturated monomer, such as an alkene, alkyne, isocyanate, etc. Additionally, the coupling reactions can be carried out in which the particles are covalently bound to saturated monomers which subsequently can be polymerized using various condensation type reactions. In fact, the present invention is compatible for use with all chemical routes known to produce polymers. The particle to monomer covalent couplings are carried out in conventional solution based chemical reactions, where the coupling takes place between the functional groups on the particle with those present in the unsaturated monomer.

7. Addition of co-polymers (if necessary): It is noted that the process herein invented is compatible with addition of co-polymer molecules during the actual polymerization process. Such co-polymer addition can be used, as needed, to optimize the properties of the resultant materials with respect to particular applications. Again, the diversity of chemistries available through the monomer-particle complexes facilitates the use of co-polymer additives, as needed.

EXAMPLE 1

The following provide a few examples of covalently functionalized fine particles successfully incorporated into inorganic/organic polymeric composites.

In this synthesis, 25 nm TiO$_2$ particles were surface functionalized with —COOH groups via plasma deposition of polyvinyl acetic acid thin films on the particles. These particles were subsequently covalently attached to the —OH groups of the monomer 4-butene 1,4 diol via a conventional ester forming condensation reaction. The resulting material was then polymerized through the double bond present in the monomer. The detailed reaction steps employed were as follows: a. 20 ml of 4-butene 1,4 diol was placed in a three-neck flask. b. 25 mg of TiO$_2$ nanoparticles functionalized with carboxylic acid groups were then added to the flask. c. One mmol dicyclohexylcarbodiimide (DCC), and 1 mmol of 4-dimethylaminopyridine were added as coupling agents to help promote the esterfication reaction. d. The mixture was then heated at 40° C. for 24 hr. e. 2 mmol of dibenzoyl peroxide, a free radical initiator, was added and the mixture heated at 40° C. for 24 h. f. The mixture was then cooled in ice bath after which cold ether was added to precipitate the solid polymer-nanocomposite material.

EXAMPLE 2

The following provide a few examples of covalently functionalized fine particles successfully incorporated into inorganic/organic polymeric composites. 2. a. In this synthesis, 15 ml of poly(ethylene glycol) acrylate (average mol wt. 375), 25 mg of carboxylic acid functionalized TiO$_2$ particles, 1 mmol of dicyclohexylcarbodiimide (DCC), and 1 mmol of 4-dimethylaminopyridine were added to a three neck flask to covalently couple the acrylate to the nanoparticles through formation of an ester linkage. b. 2 mmole of anhydrous dibenzoyl peroxide was then added, to serve as a free radical initiator to polymerize the particle/acrylate assembly. c. The solution was stirred at 40° C. for 24 h under a nitrogen atmosphere. d. The polymerization process occurred smoothly with time as shown by the increasing viscosity of the solution with elapsed time. At the end of the 24 hour period the entire sample had solidified, with the particles uniformly distributed in the solid polymer matrix.

EXAMPLE 3

The following provide a few examples of covalently functionalized fine particles successfully incorporated into inorganic/organic polymeric composites. a. In this synthesis, one mmole of solid polyethylene glycol (average molecular weight 1450) was dissolved in 15 ml of toluene and the mixture placed in a three neck flask. b. 16 mg of 30 nm Fe$_2$O$_3$ particles, functionalized with —COOH groups were then added to the flask. c. 0.0492 g of scandium triflet, a catalyst, was added to the reaction mixture. d. The mixture was refluxed, under nitrogen, at 100° C. for 24 hours. e. The toluene solvent was then evaporated, leaving a high viscosity (syrup like) material in the flask. f. After cooling of the flask, cold ether was added producing a solid precipitate of the nanocomposite polymer material.

EXAMPLE 4

The following provide a few examples of covalently functionalized fine particles successfully incorporated into inorganic/organic polymeric composites. a. In this synthesis, 30 nm Fe$_2$O$_3$ nanoparticles were surface functionalized with —NH$_2$ groups as prepared by deposition of polyallylamine thin films produced by pulsed plasma deposition of poly allylamine monomer. b. The coated particles were added to a three neck flask containing glycidyl methacrylate liquid. c. A small amount of benzyl peroxide was added to serve as the free radical initiator to overcome the inhibitors present in the acrylate. d. The mixture was warmed slightly, under a nitrogen atmosphere, with continuous stirring. e. Very quickly, the liquid solidified producing a composite-polymer material, reflecting the reaction between the amine and epoxy groups followed by the radical catalyzed polymerization of the acrylate.

EXAMPLE 5

Twenty-five nm size TiO$_2$ particles were initially functionalized with a thin film containing amine groups generated from pulsed plasma polymerization of ethylenediamine. The surface of the nanoparticles was analyzed by XPS. FIG. 1 shows a comparison of the XPS spectra of the particles before and after plasma treatment with the diamine. As shown, the plasma treated sample contains nitrogen atoms as expected from the diamine monomer. Additionally, there is an enhanced presence of C atoms.

Subsequently, 1 wt % of the TiO$_2$ amine functionalized particles were added to 1,12-Diisocyanatododecane in anhydrous hexane to which one drop of dibutyl tin laurate (DBTL) had beed added. The suspension was stirred at 50° C. for 6 h and finally ethylene glycol was added drop wise to the reaction mixture, in order to "endcap" unreacted isocyanates after the reaction. A white solid precipitate formed which was dried in vacuum at 50° C. for 12 h. FT-IR spectra were employed to document the formation of amide groups upon reaction of the functionalized $TiO_2$ particles and the isocyanates.

Figure 2:
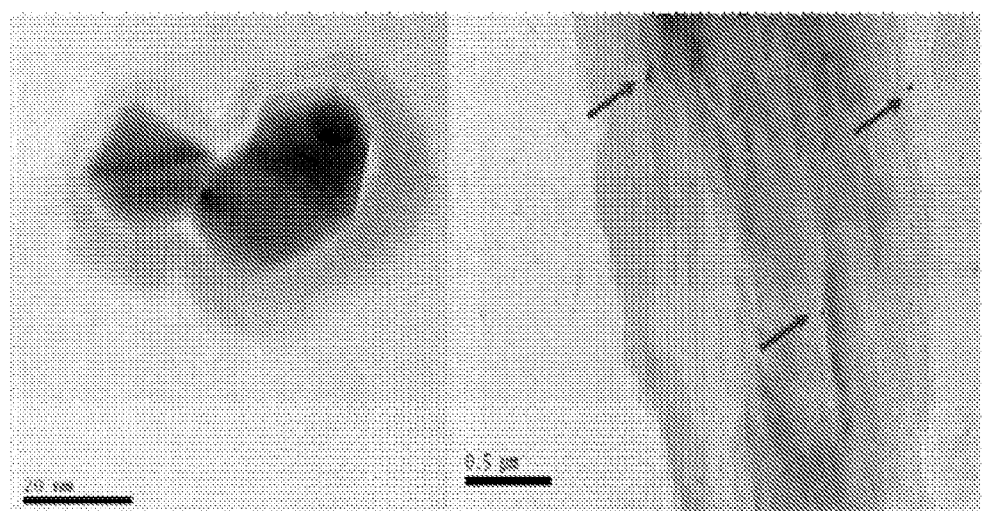
FIG. 2. Representative TEM images of amine functionalized $TiO_2$ (left) and nanocomposites with 1 wt % amine functionalized $TiO_2$ (right).

In order to examine the detailed microstructure and distribution pattern of nanoparticles (both plasma coated and uncoated) within the nanocomposites, SEM and TEM analysis were performed. The SEM studies of the functionalized nanoparticles, confirmed that the crystal structures of the nanoparticles were not modified by the plasma treatment, in confirmation of prior studies of this type. For 1 wt % loaded nanocomposite, SEM studies revealed excellent dispersion of the functionalized $TiO_2$ in the organic polymeric matrix. In contrast, the nanocomposite includes the unmodified $TiO_2$ particles exhibited clear evidence of significant aggregation of nanoparticles. SEM results were further confirmed by TEM studies, as depicted in FIG. 2. A 10+2 nm thick plasma coating can be observed on the $TiO_2$ particles (left side), and uniform dispersion of the covalently bonded particles in the polymer composite, shown at lower resolution, are exhibited in the right side of FIG. 2.

EXAMPLE 6

An example of the effect of improved physical properties of composites, synthesized via the current invention of covalent attachment of plasma functionalized particles to the polymeric matrix, were studies of the thermal stabilities of various polymeric materials. For this purpose, polymeric samples of pure polyurethane, unmodified TiO2 physically mixed within the polyurethane, and plasma modified TiO2 particles covalently bonded to the polymer matrix were each subjected to thermogravimetric analysis. Both the physically mixed and covalently bound nanocomposite samples contained 1 wt % TiO2. Experimentally, it was observed that the thermal stability of the TiO2 plasma treated, covalently bonded composite sample exhibited significantly improved thermal stability compared to the pure polymer and the composite containing the physically mixed TiO2. For example, as shown in Table 1, the 5% wt loss temperature of the composite having the covalently bound particles is 2470 C, which is significantly higher than the value of 2040 C for the physically mixed sample and the 1940 C value for the pure polyurethane sample.

TABLE 1

Representative Thermogravimetric analysis(TGA) data for polyurethane and nanocomposites

| polyurethane | $TiO_2$ loading (Wt %) | Functionalized $TiO_2$ loading (Wt %) | 5% wt loss temperature (° C.) |
|---|---|---|---|
| pure | — | — | 194 |
|  | 1.0 | — | 204 |
|  | — | 1.0 | 247 |

Based on these simple examples provided above, it will be apparent to those schooled in the art that the covalent attachment of fine particles to functionalized monomers represents a viable route to synthesis of new and improved composite materials. Although the examples noted above were carried out with nanoparticles, the technology developed in this invention is applicable to a wide range of particles sizes and shapes, including such materials as fibers and other shaped objects. This simply reflects the fact that the key surface functionalization step of the present invention is carried out using a gas phase process, thus only requiring contact between the surface and the gas molecules. Additionally, although the particles used in the above examples happen to be inorganic oxides, this invention will apply equally well to all particle compositions, including metals, as well as organic particles.

Using the present invention, an extremely wide range of uses are easily recognized for the composite materials produced via the present invention. These will include materials used in electronics, photonics, sensors, biofunctional materials and devices, and many other applications. Simple examples of some such applications would include coatings, electrical condensers; improved flame resistant materials; improved fracture resistant materials; electrically conductive polymers; high dielectric constant materials, including high k flexible thin films; polymers having improved abrasion resistance and reduced frictional coefficients; improved RF shielding materials. The skilled artisan will recognize that these examples of applications for these materials, in which the covalently bound particles are uniformly dispersed in the polymer matrices, will provide superior performance to materials currently available for these and many other applications.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A method of making a material comprising:
   covalently plasma grafting an organic molecule onto a titanium dioxide particle, wherein the organic molecule comprises an ethylene diamine;
   covalently binding an organic monomer to the organic molecule on the titanium dioxide particle, wherein the organic monomer comprises a 1,12-diisocyanotodecane; and
   polymerizing the more than one organic monomers into a functionalized hybrid polymer.

2. The method of claim 1, wherein the plasma grafting uses a pulsed plasma.

3. The method of claim 1, wherein the titanium dioxide particles comprise nanoparticles.

4. The method of claim 1, wherein the step of covalently binding the organic molecule to the particle is defined further as a plasma grafting by gas phase pulsed plasma covalent binding of the organic molecule to the titanium dioxide particle.

5. The method of claim 1, wherein the titanium dioxide particle comprises an element, alloy, oxide or nitride of a metal selected from the group consisting of Ga, Au, Ag, Cu, Al, Ta, Ti, Ru, Ir, Pt, Pd, Os, Mn, Hf, Zr, V, Nb, La, Y, Gd, Sr, Ba, Cs, Cr, Co, Ni, Zn, Ga, In, Cd, Rh, Re, W, Mo, Si, Se, Te, As, Sb, Bi, Ge, Sn, Pb.

6. The method of claim 1, wherein the material is formed into a film, a gel, a block, a powder, a pellet or a solution.

7. A method of making hybrid composite materials comprising:
   covalently plasma grafting an ethylene diamine molecule onto a titanium dioxide particle to form a functionalized particle;
   covalently attaching a 1,12-diisocyanotodecane monomer to the ethylene diamine molecule to form a functionalized monomer; and
   polymerizing the functionalized monomers into a hybrid composite polymer.

8. The method of claim 7, wherein the plasma grafting is using a pulsed plasma.

9. The method of claim 7, wherein the titanium dioxide particles comprise nanoparticles.

10. The method of claim 7, wherein the plasma grafting step is by gas phase pulsed plasma covalent binding of the organic molecule to the titanium dioxide particle.

11. The method of claim 7, wherein the material is formed into a film, a gel, a block, a powder, a pellet or a solution.

* * * * *